(12) United States Patent
Park et al.

(10) Patent No.: US 11,596,074 B2
(45) Date of Patent: Feb. 28, 2023

(54) INFOLDING-TYPE HINGE STRUCTURE HAVING FLEXIBLE DISPLAY PANEL INSTALLED THEREIN

(71) Applicant: AUFLEX CO., LTD., Hwaseong-si (KR)

(72) Inventors: Hyun Min Park, Suwon-si (KR); Seoung Jun Lee, Uiwang-si (KR)

(73) Assignee: AUFLEX CO., LTD., Hwaseong-si (KR)

( * ) Notice: Subject to any disclaimer, the term of this patent is extended or adjusted under 35 U.S.C. 154(b) by 141 days.

(21) Appl. No.: 17/049,703

(22) PCT Filed: Apr. 25, 2019

(86) PCT No.: PCT/KR2019/005035
§ 371 (c)(1),
(2) Date: Oct. 22, 2020

(87) PCT Pub. No.: WO2019/209060
PCT Pub. Date: Oct. 31, 2019

(65) Prior Publication Data
US 2021/0243908 A1  Aug. 5, 2021

(30) Foreign Application Priority Data

Apr. 25, 2018  (KR) .................. 10-2018-0048199
May 3, 2018  (KR) .................. 10-2018-0051503

(51) Int. Cl.
*G06F 1/16* (2006.01)
*H05K 5/02* (2006.01)
*H05K 5/00* (2006.01)

(52) U.S. Cl.
CPC ......... *H05K 5/0226* (2013.01); *G06F 1/1616* (2013.01); *G06F 1/1652* (2013.01); *G06F 1/1681* (2013.01); *H05K 5/0017* (2013.01)

(58) Field of Classification Search
None
See application file for complete search history.

(56) References Cited

U.S. PATENT DOCUMENTS 9,518,414 B1 * 12/2016 Chen .................... E05D 11/082
9,557,771 B2 * 1/2017 Park ..................... H04M 1/022
(Continued)

FOREIGN PATENT DOCUMENTS

KR 10-2016-0087972 7/2016
KR 10-2018-0040482 4/2018

OTHER PUBLICATIONS

KIPO, PCT Search Report & Written Opinion of PCT/KR2019/005035 dated Aug. 14, 2019.

*Primary Examiner* — Anthony Q Edwards
*Assistant Examiner* — Rashen E Morrison
(74) *Attorney, Agent, or Firm* — Lex IP Meister, PLLC

(57) ABSTRACT

Provided is an in-folding type hinge structure having a flexible display panel installed therein in a mobile communication terminal in which a flexible display panel is provided in a pair of panel portions which are foldably connected to each other, in which a stable folding operation can be performed while the panel portions are being folded or unfolded and the panel portions do not rotate over 180 degrees when the panel portions are fully unfolded, whereby damage of the flexible display panel provided on the surfaces of the panel portions can be prevented.

3 Claims, 18 Drawing Sheets

(56) References Cited

U.S. PATENT DOCUMENTS

| | | | |
|---|---|---|---|
| 9,677,308 B1* | 6/2017 | Chen | G06F 1/1681 |
| 9,791,892 B2* | 10/2017 | Park | G06F 1/1635 |
| 10,015,897 B1* | 7/2018 | Hong | H05K 5/0217 |
| 10,480,227 B1* | 11/2019 | Chen | E05D 3/122 |
| 11,016,530 B2* | 5/2021 | Watamura | G06F 1/1652 |
| 11,259,428 B2* | 2/2022 | Kang | H05K 5/0226 |
| 11,320,871 B2* | 5/2022 | Lin | E05D 11/1014 |
| 11,334,122 B2* | 5/2022 | Hsu | F16C 11/04 |
| 2015/0233162 A1* | 8/2015 | Lee | G06F 1/1652 16/223 |
| 2017/0275935 A1* | 9/2017 | Shang | E05D 3/12 |
| 2019/0166703 A1* | 5/2019 | Kim | G06F 1/1681 |

\* cited by examiner

INFOLDING-TYPE HINGE STRUCTURE HAVING FLEXIBLE DISPLAY PANEL INSTALLED THEREIN

TECHNICAL FIELD

The invention relates to an in-folding type hinge structure having a flexible display panel installed therein and, more particularly, to an in-folding type hinge structure having a flexible display panel installed therein in a mobile communication terminal in which a flexible display panel is provided in a pair of panel portions which are foldably connected to each other, in which a rotation means is provided in a folding portion connecting the pair of panel portions such that the folding portion can perform a stable folding operation while the panel portions are being folded or unfolded and the panel portions do not rotate over 180 degrees when the panel portions are fully unfolded, whereby damage of the flexible display panel provided on the surfaces of the panel portions can be prevented.

BACKGROUND ART

Mobile communication terminals are configured to perform various functions. Examples of the functions include a data and speech communication function, a function of capturing a still image or a moving image using a camera, a speech storing function, a function of reproducing a music file using a speaker system, and a function of displaying a still image or a moving image (a video).

Some mobile communication terminals have additional functions for playing games, and some mobile communication terminals are embodied as multimedia devices. Recently, mobile communication terminals can also receive broadcast or multicast signals and reproduce a video or a television program.

Researches for supporting and improving other functions of mobile communication terminals in addition to the above-mentioned functions have been carried out. These researches include modification and improvement of structural constituents of the mobile communication terminals and addition and improvement of software or hardware.

In general, a display module of a mobile communication terminal displays information which is processed by the mobile communication terminal. For example, when the mobile communication terminal is in a call mode, the display module displays a user interface (UI) or a graphic user interface (GUI) associated with a call.

When the mobile communication terminal is in a video call mode or an image capturing mode, the display module displays a captured or/and received image, a UI, or a GUI. The display module includes a liquid crystal display (LCD), a thin-film transistor liquid crystal display (TFT LCD), an organic light emitting diode (OLED), a flexible display, or a 3D display.

A flexible display (or a flexible LCD) has been regularly researched with its merit of deformability. It takes much time to use a rolled display like a paper roll as shown in science-fiction movies.

Therefore, transitional forms of flexible displays will be many used until the flexible displays are regularly used with sufficient development thereof, and these transitional forms will be similar to current structures of communication terminals. Accordingly, there is necessity for description of usage and protection of flexible displays when such flexible displays are used in mobile communication terminals.

SUMMARY OF THE INVENTION

Technical Problem

An objective of the invention is to provide an in-folding type hinge structure having a flexible display panel installed therein in a mobile communication terminal in which a flexible display panel is provided in a pair of panel portions which are foldably connected to each other, in which a stable folding operation can be performed while the panel portions are being folded or unfolded and the panel portions do not rotate over 180 degrees when the panel portions are fully unfolded, whereby damage of the flexible display panel provided on the surfaces of the panel portions can be prevented.

Solution to Problem

In order to achieve the above-mentioned objective, there is provided an in-folding type hinge structure having a flexible display panel installed therein, including: a hinge portion in which, in a state in which an inside support (22), a rotation support (32) of which an inner surface comes into contact with the inside support (22), and an outside support (42) that comes into contact with an outer surface of the rotation support (32) are coupled to each other, a guide rod (46) is inserted into a groove (44) of the outside support, passes through a guide groove (34) extending longitudinally in the rotation support (32), and is inserted into a groove (23) of the inside support (22).

Two inside supports (22), two rotation supports (32), and two outside supports (42) are installed in a connecting portion (60) which is provided in a reception portion (54) between a pair of bodies (50) and in which gears of the two rotation supports (32) engage with each other such that the inside supports (22), the rotation supports (32), and the outside supports (42) are able to rotate simultaneously in opposite directions using two shafts (56) in a state in which the inside supports (22), the rotation supports (32), and the outside supports (42) are coupled to each other by the guide rod (46).

Dual rotation including rotation of the two rotation supports (32) by the same angle in opposite directions and rotation of the inside supports (22) and the outside supports (42) along the guide grooves of the rotation supports (32) with the rotation of the rotation supports (32) is performed in the connecting portion (60) of the hinge portion.

A guide groove (24) is formed on both side surfaces of each inside support (22), a guide protrusion (52) formed to protrude from an inner side surface of each body (50) is inserted into the corresponding guide groove (24) to limit a range in which the inside support (22) rotates, and the inside supports (22) rotate when the pair of rotation supports (32) of which gears (36) engage with each other rotates.

The guide rod (46) may have a large length, the groove (23) of each inside support (22) may be formed to penetrate the inside support (22), the guide rod (46) may be formed to pass through the groove (44) of the corresponding outside support (42), the guide groove (34), and the groove of the inside support (22), and a part of the guide rod (46) having passed therethrough may be directly coupled to a panel portion (10).

The in-folding type hinge structure having a flexible display panel installed therein may further include a semiautomatic drive portion that is provided along with the hinge portion.

The semiautomatic drive portion may include a body portion (80) that has a groove formed therein, a spring (84) that is inserted into the body portion (80), a translation cam (82) that is inserted into the body portion (80) into which the spring (84) is inserted and moves translationally, a rotation cam (87) that rotates in a state in which the rotation cam engages with the translation cam (82) such that the translation cam (82) moves translationally, a connecting shaft (94) that passes through and connects the rotation cam (87), the translation cam (82), and the spring (84) such that the rotation cam (87), the translation cam (82), and the spring (84) are not detached, and a connecting portion (90) that is provided with a gear (92) which is coupled to the body portion (80).

Advantageous Effects of Invention

According to the invention, it is possible to provide an in-folding type hinge structure having a flexible display panel installed therein in a mobile communication terminal in which a flexible display panel is provided in a pair of panel portions which are foldably connected to each other, in which the flexible display panel is formed of a flexible material to display an image such as a moving image such that a stable folding operation can be performed while the panel portions are being folded or unfolded and the panel portions do not rotate over 180 degrees when the panel portions are fully unfolded, whereby damage of the flexible display panel provided on the surfaces of the panel portions can be prevented.

DESCRIPTION OF EMBODIMENTS

Figure 1:
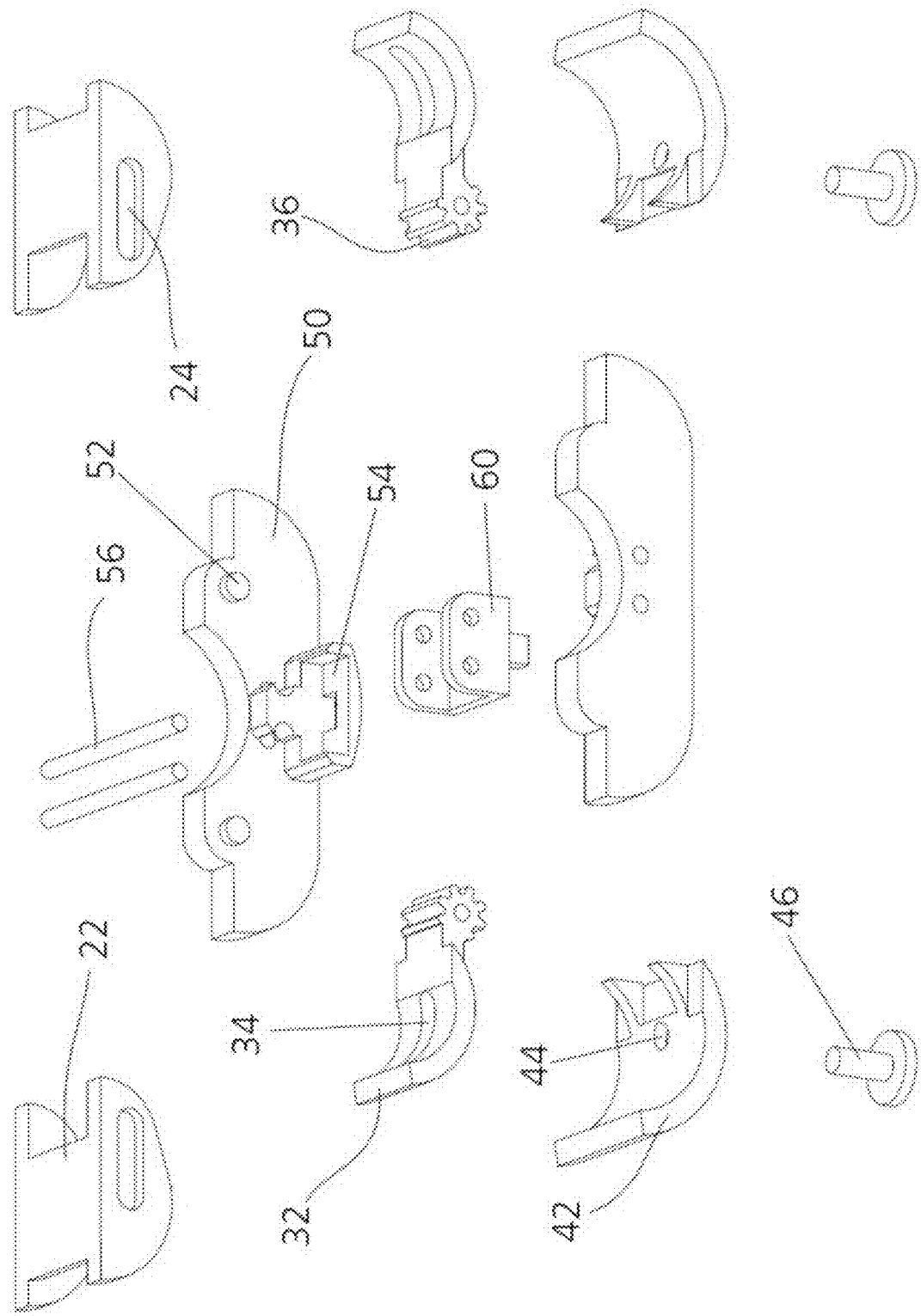
FIG. 1 is an exploded perspective view of one hinge portion in an in-folding type hinge structure having a flexible display panel installed therein according to the invention.
Figure 2:
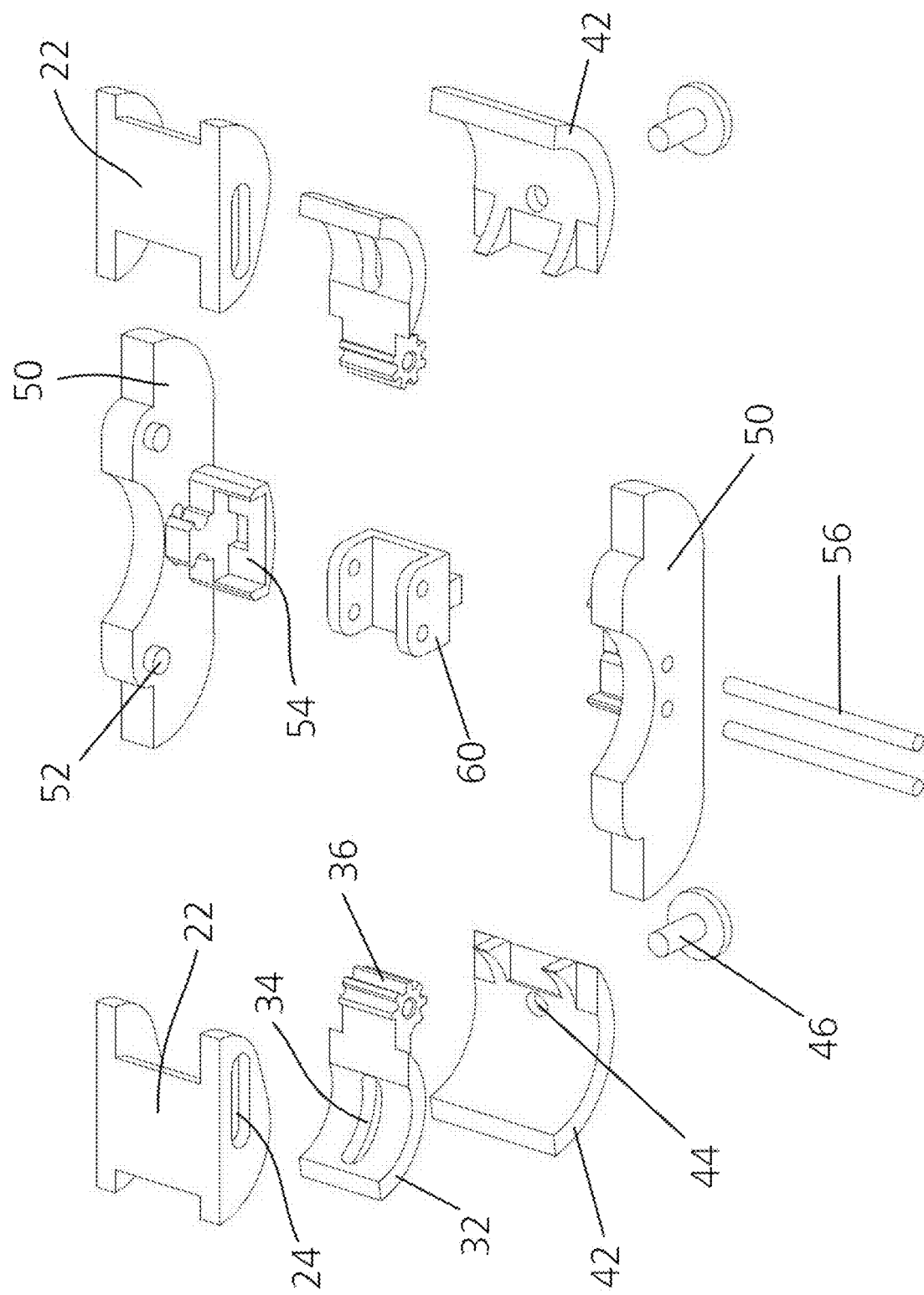
FIG. 2 is an exploded perspective view when the exploded perspective view of FIG. 2 is seen from the opposite direction.
Figure 3:
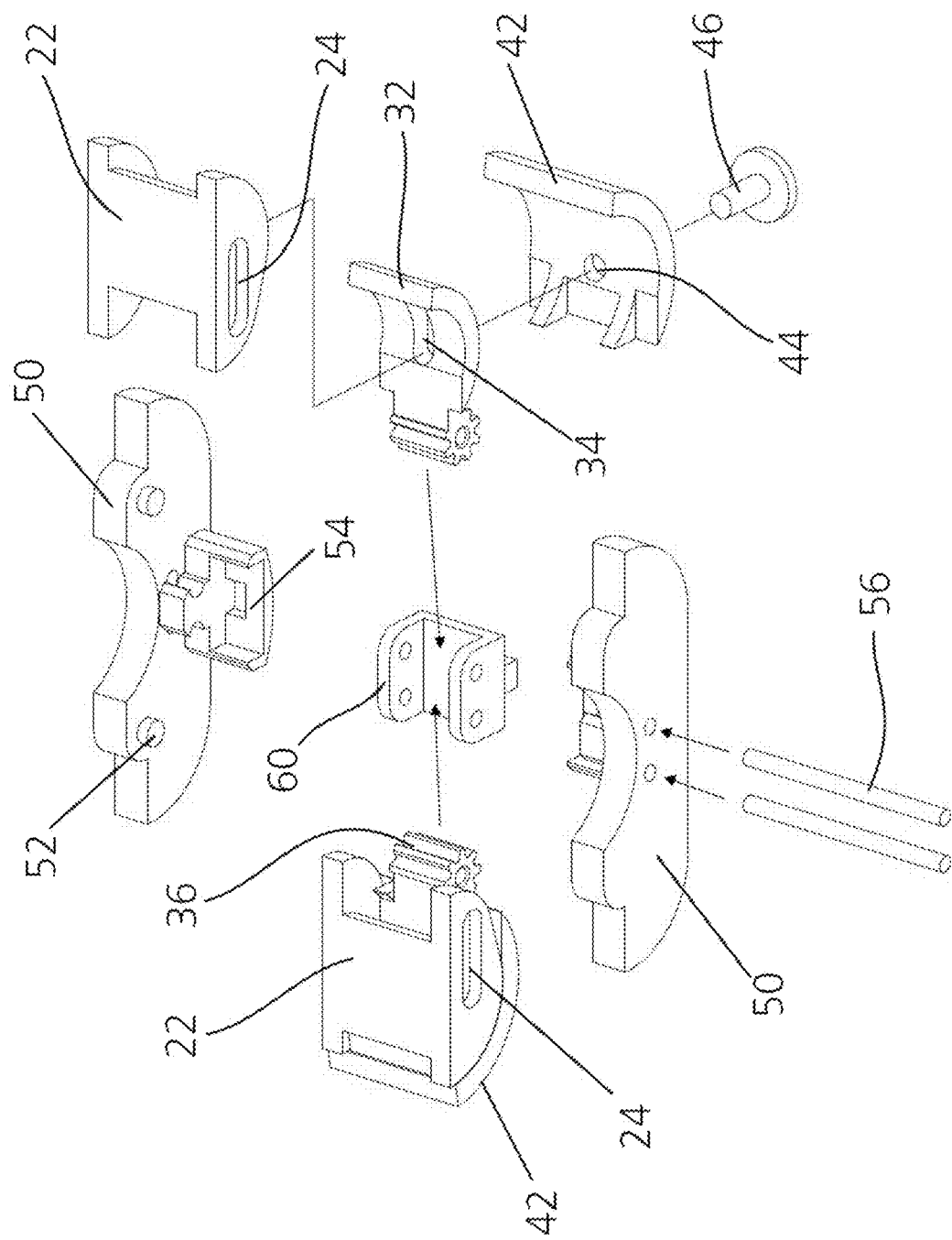
FIG. 3 is an exploded perspective view illustrating a state in which an outside support, a rotation support, and an inside support have been assembled in the exploded perspective view of FIG. 1.
Figure 4:
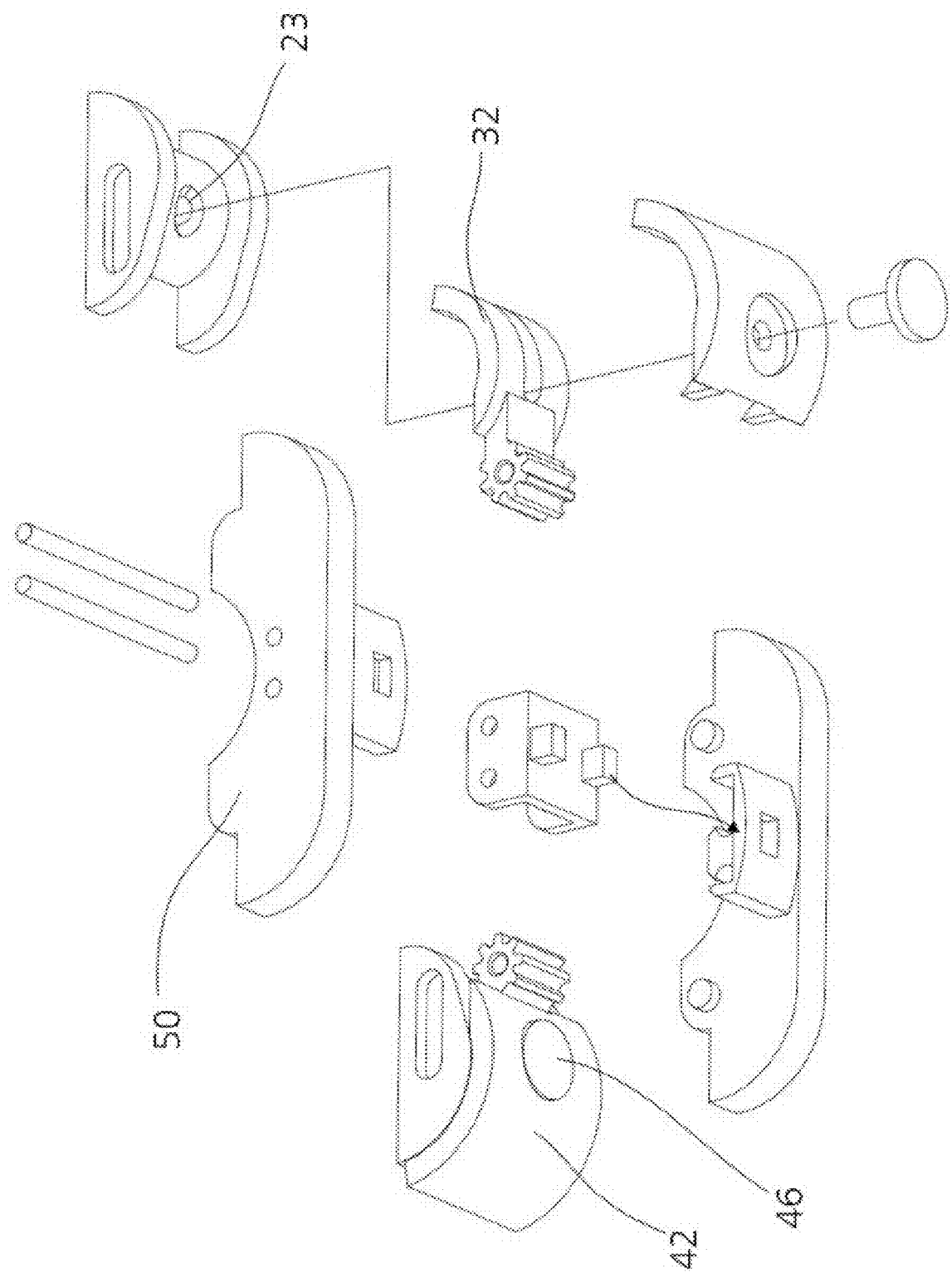
FIG. 4 is an exploded perspective view when the exploded perspective view of FIG. 3 is seen from down.

FIG. 1 is an exploded perspective view of one hinge portion in an in-folding type hinge structure having a flexible display panel installed therein according to the invention. FIG. 2 is an exploded perspective view when the exploded perspective view of FIG. 2 is seen from the opposite direction. FIG. 3 is an exploded perspective view illustrating a state in which an outside support, a rotation support, and an inside support have been assembled in the exploded perspective view of FIG. 1. FIG. 4 is an exploded perspective view when the exploded perspective view of FIG. 3 is seen from down.

Referring to FIGS. 1 to 4, in a hinge portion constituting an in-folding type hinge structure having a flexible display panel installed therein according to the invention, in a state in which an inside support 22, a rotation support 32 of which an inner surface comes into contact with the inside support 22, and an outside support 42 that comes into contact with an outer surface of the rotation support 32 are coupled to each other, a guide rod 46 is inserted into a groove 44 of the outside support, passes through a guide groove 34 extending longitudinally in the rotation support 32, and is inserted into a groove 23 of the inside support 22.

In a state in which two inside supports 22, two rotation supports 32, and two outside supports 42 are installed in a connecting portion 60 which is provided in a reception portion 54 between a pair of bodies 50 and in which gears of the two rotation supports 32 engage with each other such that the inside supports 22, the rotation supports 32, and the outside supports 42 are able to rotate simultaneously in opposite directions using two shafts 56 in a state in which the inside supports 22, the rotation supports 32, and the outside supports 42 are coupled to each other by the guide rod 46.

The hinge portion according to the invention has a configuration in which dual rotation including rotation of the two rotation supports 32 by the same angle in opposite directions and rotation of the inside supports 22 and the outside supports 42 along the guide grooves of the rotation supports 32 with the rotation of the rotation supports 32 is performed in the connecting portion 60 of the hinge portion.

In the hinge portion according to the invention, a guide groove 24 is formed on both side surfaces of each inside support 22, a guide protrusion 52 formed to protrude from an inner side surface of each body 50 is inserted into the corresponding guide groove 24 to limit a range in which the inside support 22 rotates, and the inside supports 22 rotate when the pair of rotation supports 32 of which gears 36 engage with each other rotates.

According to the invention, the guide rod 46 has a larger length than that illustrated in the drawings. The groove 23 of each inside support 22 is formed to penetrate the inside support 22, the guide rod 46 is formed to pass through the groove 44 of the corresponding outside support 42, the guide groove 34, and the groove of the inside support 22. A part of the guide rod 46 having passed therethrough is directly coupled to a panel portion 10.

Figure 5:
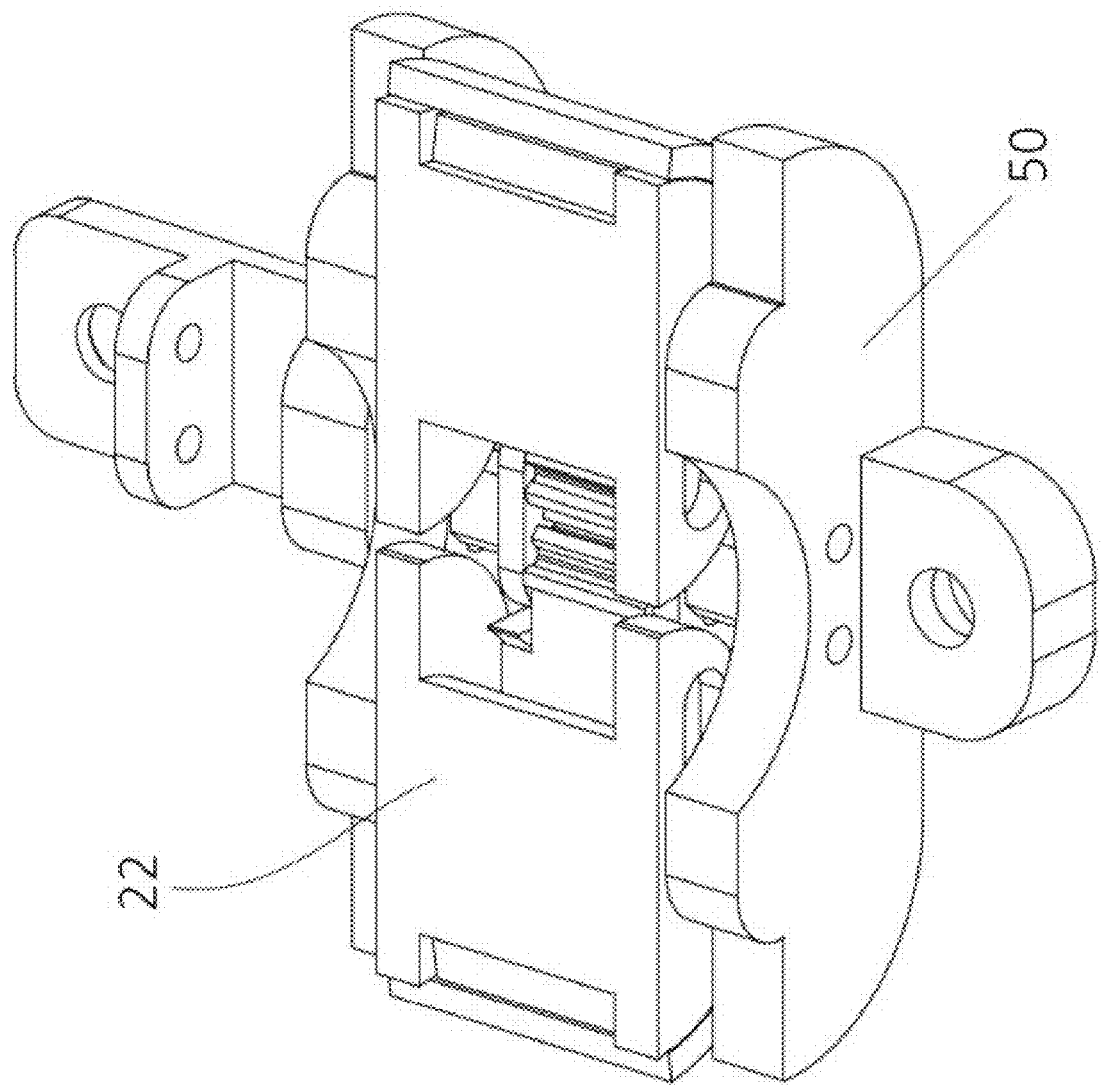
FIG. 5 is a perspective view illustrating one hinge portion which has been completely assembled in the in-folding type hinge structure having a flexible display panel installed therein according to the invention.

FIG. 5 is a perspective view illustrating one hinge portion which has been completely assembled in the in-folding type hinge structure having a flexible display panel installed therein according to the invention.

Referring to FIG. 5, a pair of inside supports 22 which has been assembled into the hinge portion according to the invention rotates by the same angle in opposite directions in a state in which the shafts 56 are inserted into the gears 36, and the two inside supports 22 rotate along the guide grooves 32 of the rotation supports 32.

According to the invention, a range in which the inside supports 22 rotate is limited by coupling to the guide protrusions 52 of the bodies 50 which are inserted into the guide groove 24 formed in the side surface of the inside support 22.

Figure 6:
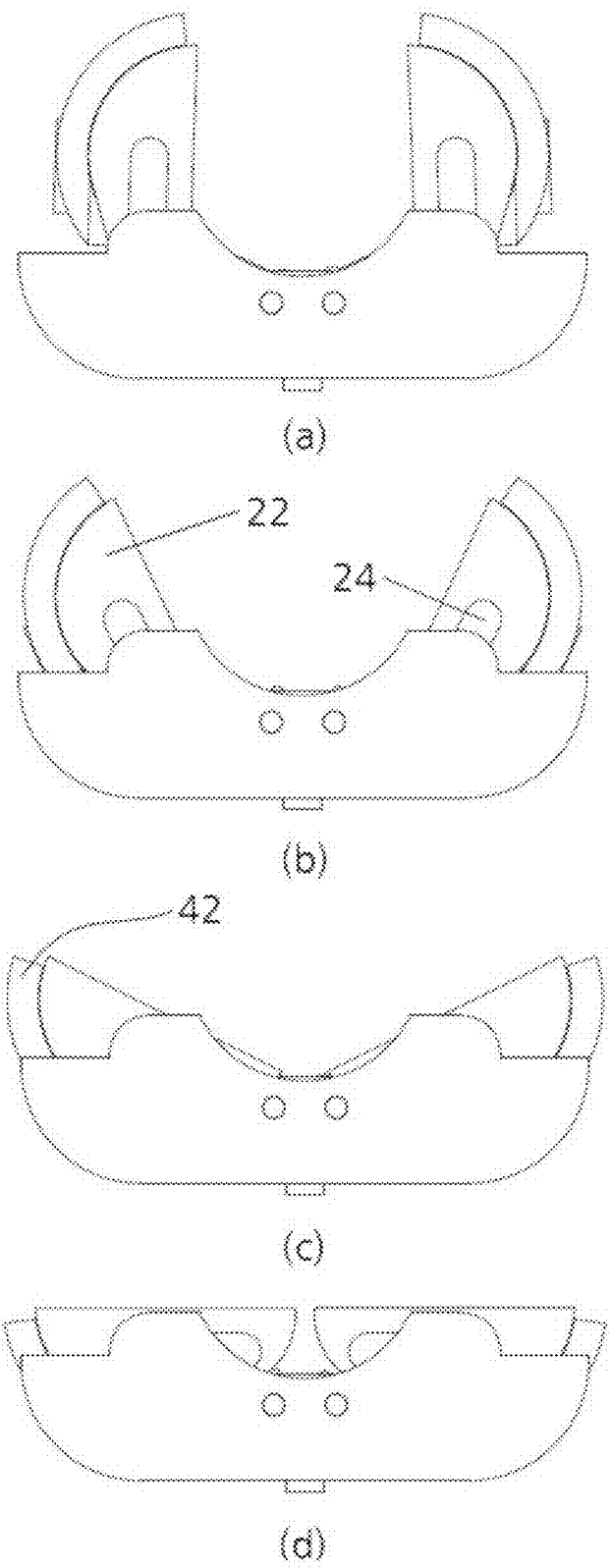
FIG. 6 is a front view illustrating the assembled hinge portion according to the invention by operation stages in which the assembled hinge portion is unfolded.
Figure 7:
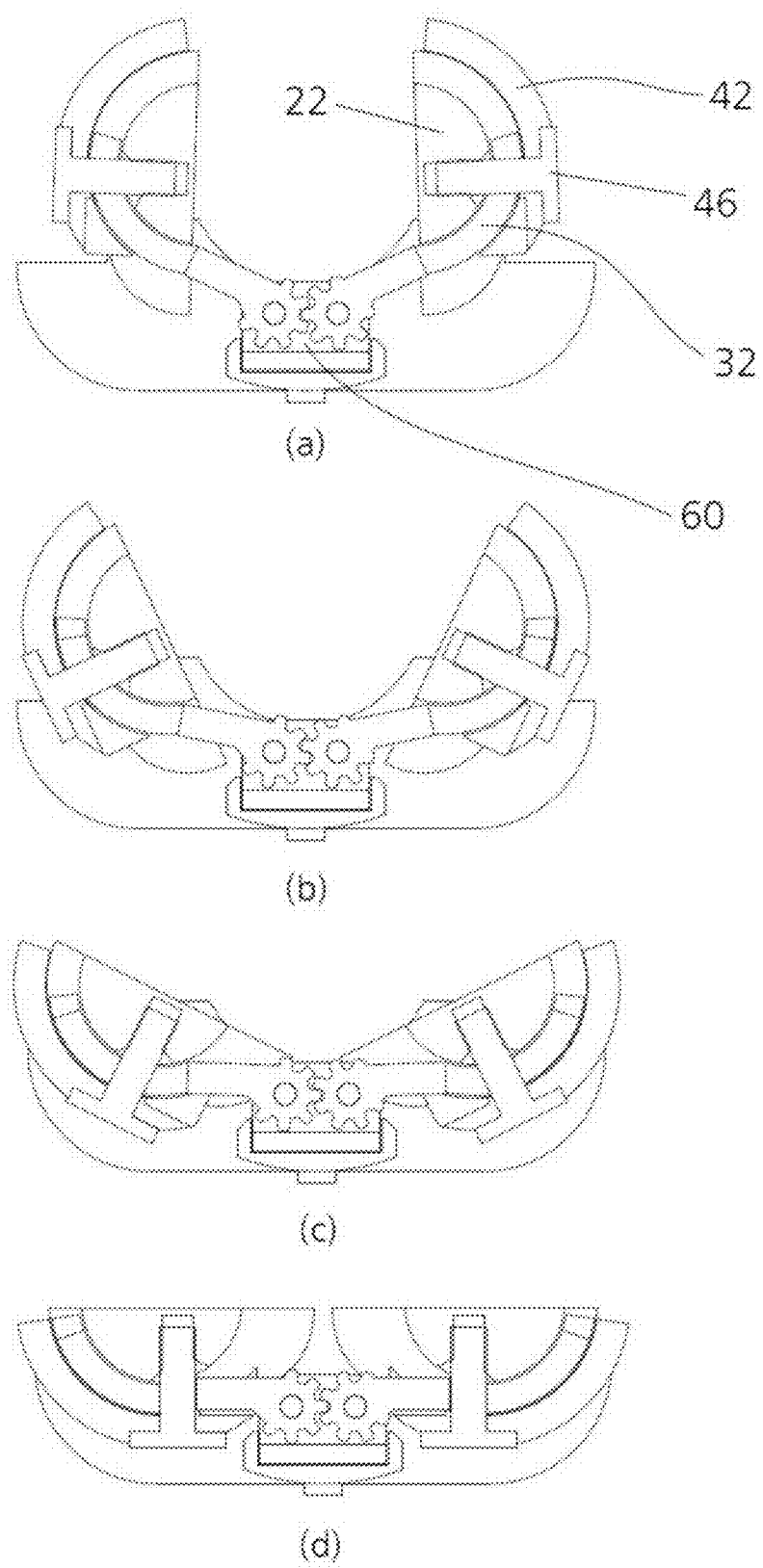
FIG. 7 is a front sectional view illustrating movement of a guide rod which is inserted into a guide groove of a rotation support in the assembled hinge portion according to the invention by operation stages in which a pair of inside supports of the hinge portion is unfolded.
Figure 8:
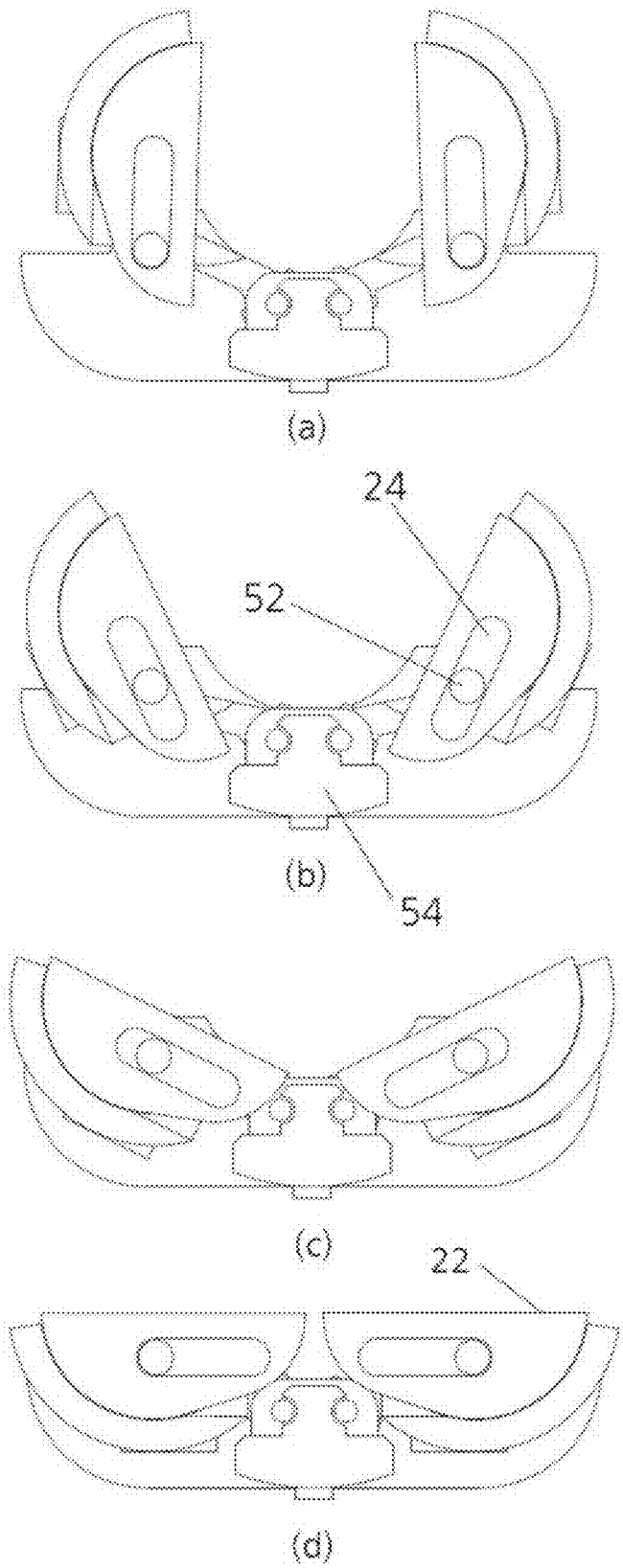
FIG. 8 is a front sectional view illustrating movement of a guide protrusion protruding from one side surface of a hinge portion body along a guide groove formed in the inside support in the assembled hinge portion according to the invention by operation stages in which the pair of inside supports is unfolded.

FIG. 6 is a front view illustrating the assembled hinge portion according to the invention by operation stages in which the assembled hinge portion is unfolded. FIG. 7 is a front sectional view illustrating movement of a guide rod which is inserted into a guide groove of a rotation support in the assembled hinge portion according to the invention by operation stages in which a pair of inside supports of the hinge portion is unfolded. FIG. 8 is a front sectional view illustrating movement of a guide protrusion protruding from one side surface of a hinge portion body along a guide groove formed in the inside support in the assembled hinge portion according to the invention by operation stages in which the pair of inside supports is unfolded.

Referring to FIGS. 6 to 8, when the two inside supports 22 are unfolded, the guide protrusions 52 formed to protrude from an inner surface of the bodies 50 moves along the guide grooves 24 formed in the side surfaces of the inside supports 22 in a state in which the guide protrusions are inserted into the guide grooves 24. When the two rotation supports 32 are unfolded while rotating with respect to the shafts 56 inserted into the gears 36, the two inside supports 22 also rotate along the guide grooves 34 of the rotation supports 32.

Figure 9:
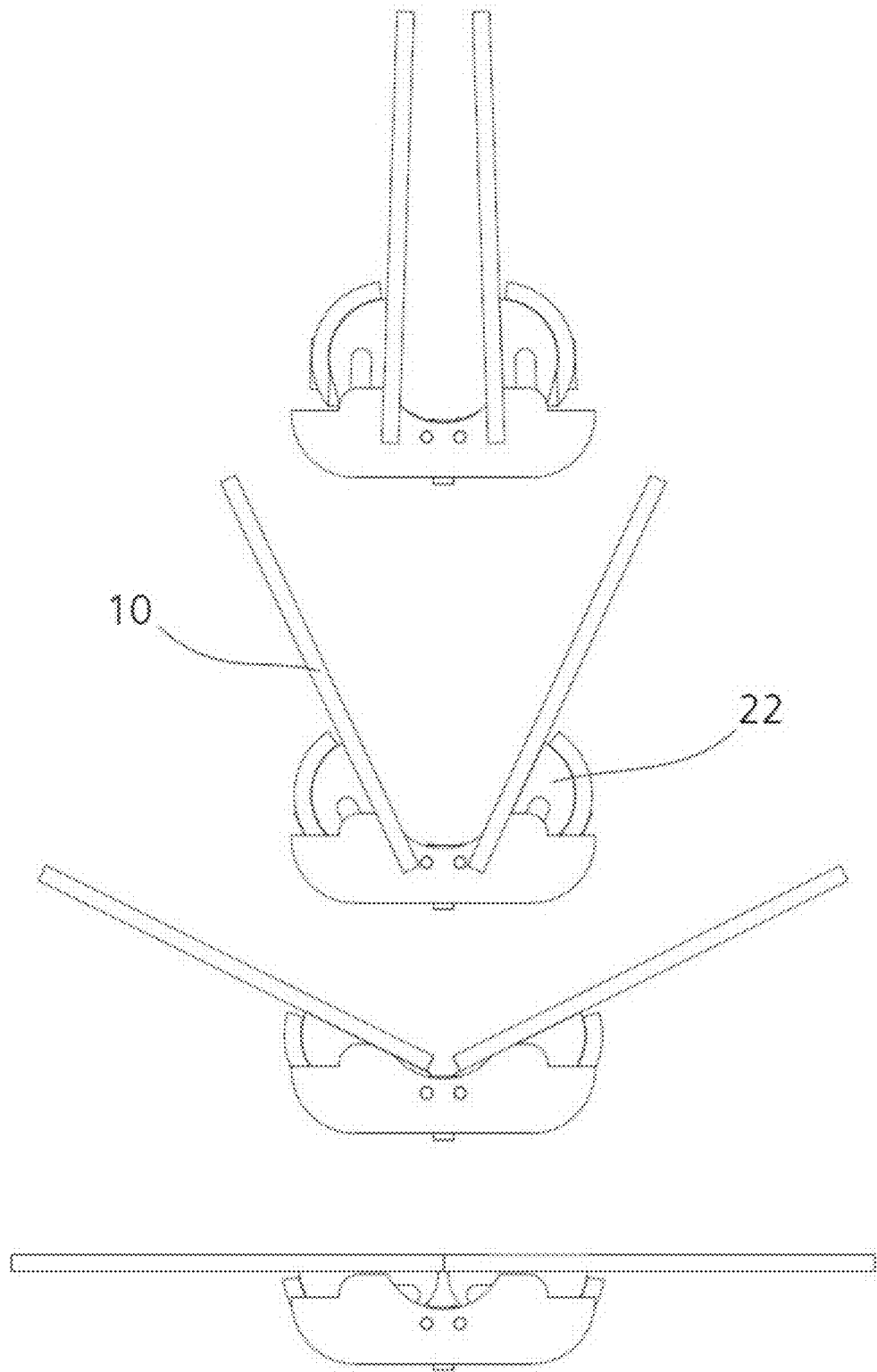
FIG. 9 is a diagram illustrating movement of the hinge portion in a state in which a panel portion is coupled to each of a pair of inside supports of the hinge portion according to the invention by operation stages in which a pair of panel portions is unfolded.
Figure 10:
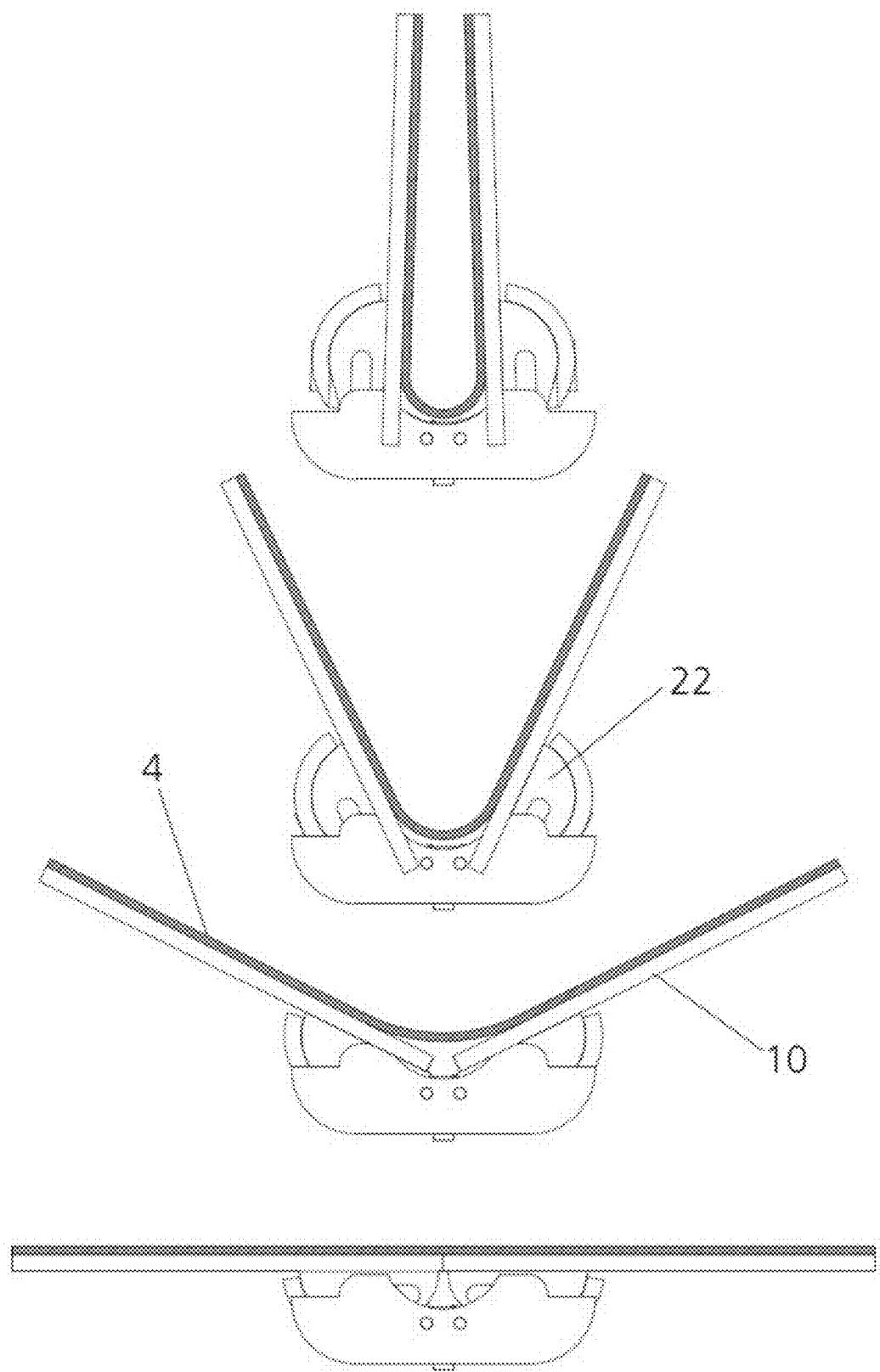
FIG. 10 is a diagram illustrating movement of the hinge portion in a state in which a panel is coupled to each of a pair of inside supports of the hinge portion according to the invention and a flexible display panel is provided in the panel portion by operation stages in which a pair of panel portions is unfolded.

FIG. 9 is a diagram illustrating movement of the hinge portion in a state in which a panel portion is coupled to each of a pair of inside supports of the hinge portion according to the invention by operation stages in which a pair of panel portions is unfolded. FIG. 10 is a diagram illustrating movement of the hinge portion in a state in which a panel is coupled to each of a pair of inside supports of the hinge portion according to the invention and a flexible display panel is provided in the panel portion by operation stages in which a pair of panel portions is unfolded.

Referring to FIGS. 9 and 10, a panel portion 10 is coupled to each of the inside supports 22 on both lateral sides, and a flexible display panel 4 which is formed of a flexible material and on which an image or the like is displayed is provided on the surface of the panel portion.

Figure 11:
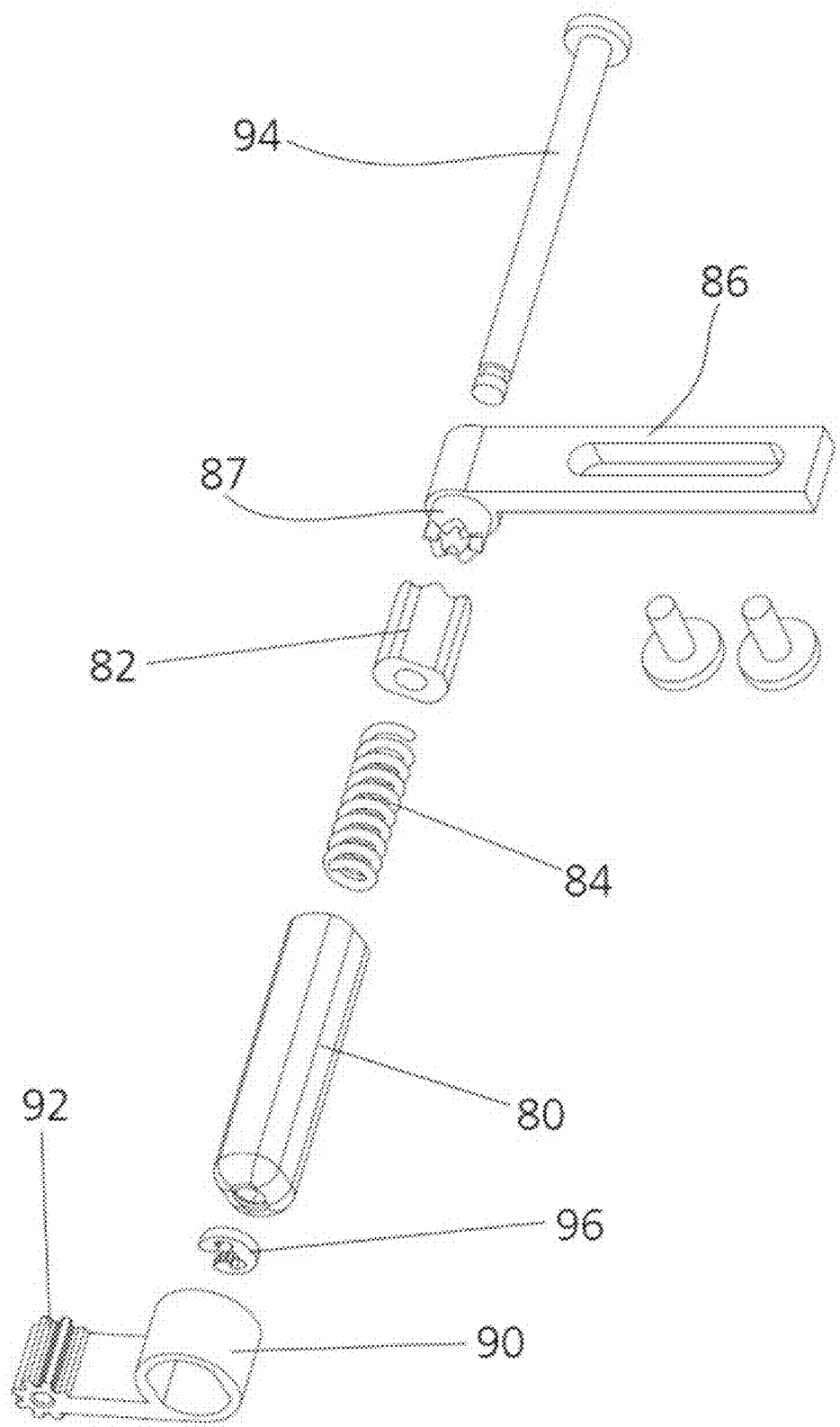
FIG. 11 is an exploded perspective view illustrating a semiautomatic drive portion which is provided along with the hinge portion in the in-folding type hinge structure having a flexible display panel installed therein according to the invention.

FIG. 11 is an exploded perspective view illustrating a semiautomatic drive portion which is provided along with the hinge portion in the in-folding type hinge structure having a flexible display panel installed therein according to the invention.

Referring to FIG. 11, a semiautomatic drive portion that is installed along with the hinge portion in the in-folding type hinge structure having a flexible display panel installed therein according to the invention includes a body portion 80 that has a groove formed therein, a spring 84 that is inserted into the body portion 80, a translation cam 82 that is inserted into the body portion 80 into which the spring 84 is inserted and moves translationally, a rotation cam 87 that rotates in a state in which the rotation cam engages with the translation cam 82 such that the translation cam 82 moves translationally, a connecting shaft 94 that passes through and connects the rotation cam 87, the translation cam 82, and the spring 84 such that the rotation cam 87, the translation cam 82, and the spring 84 are not detached, and a connecting portion 90 that is provided with a gear 92 which is coupled to the body portion 80.

Figure 12:
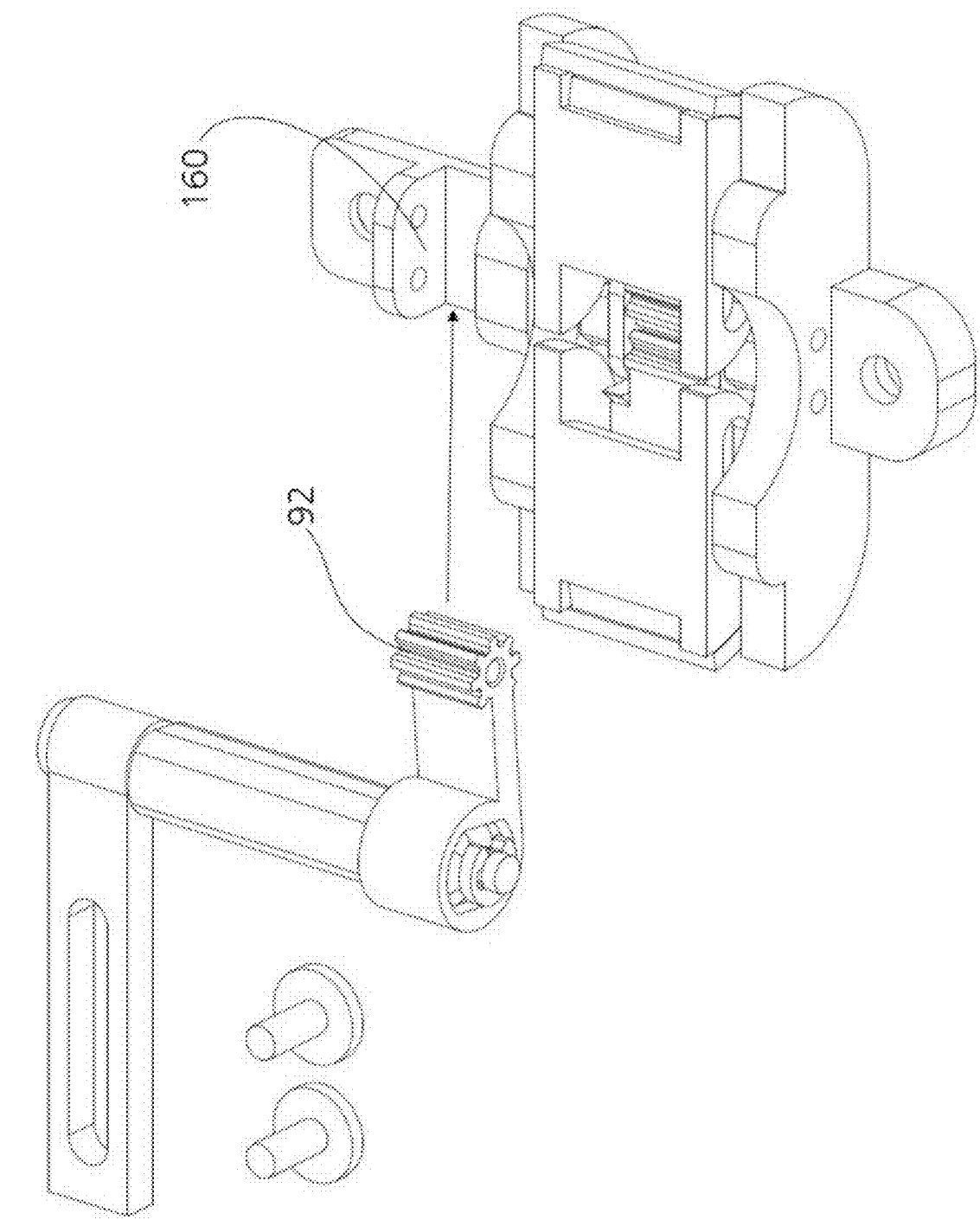
FIG. 12 is a perspective view illustrating a state in which the hinge portion and the semiautomatic drive portion are provided together in the in-folding type hinge structure having a flexible display panel installed therein according to the invention.
Figure 13:
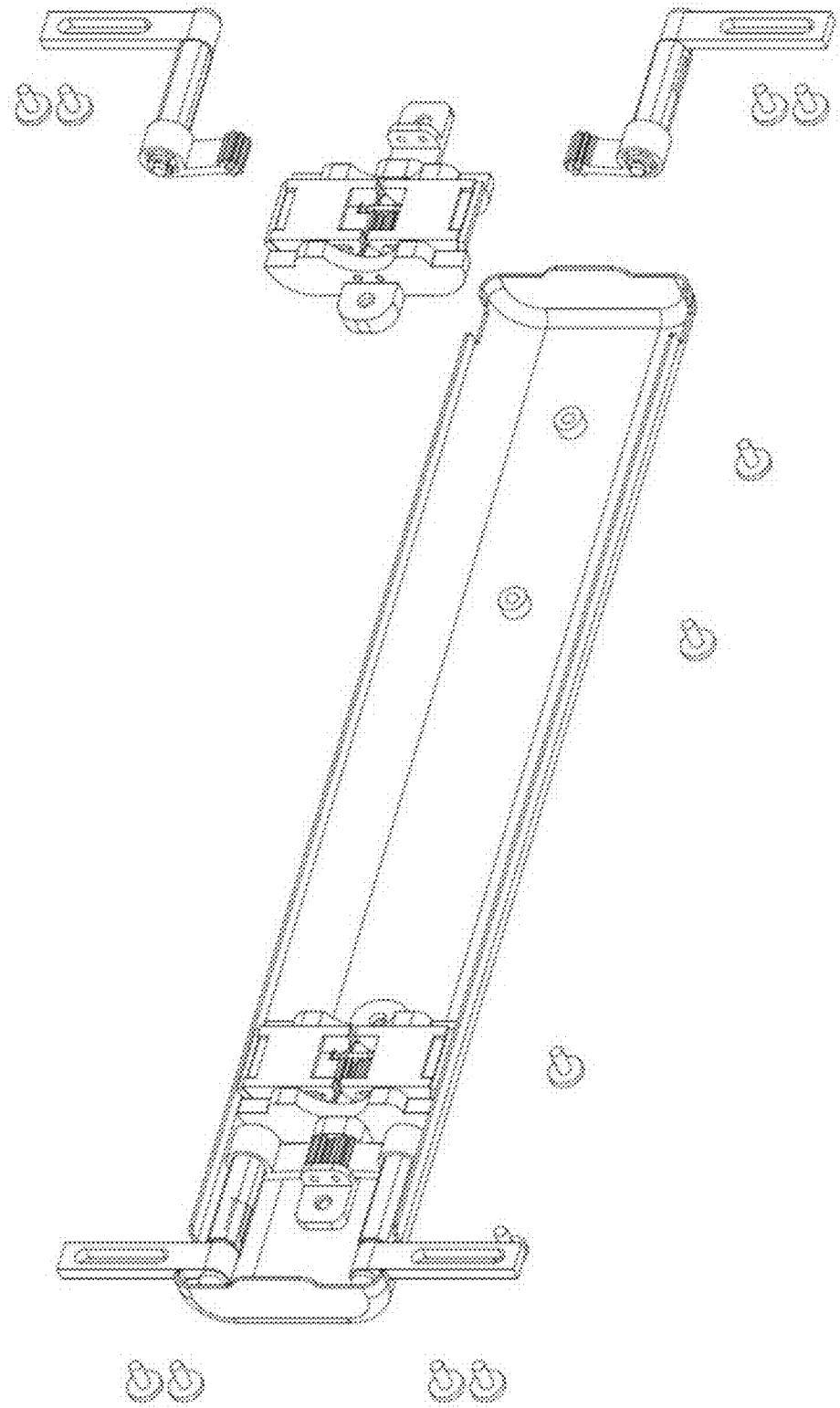
FIG. 13 is a perspective view illustrating a state in which the semiautomatic drive portion is provided on each of the right and left sides of one hinge portion according to the invention.

FIG. 12 is a perspective view illustrating a state in which the hinge portion and the semiautomatic drive portion are provided together in the in-folding type hinge structure having a flexible display panel installed therein according to the invention. FIG. 13 is a perspective view illustrating a state in which the semiautomatic drive portion is provided on each of the right and left sides of one hinge portion according to the invention.

Referring to FIGS. 12 and 13, the assembled semiautomatic drive portions forming a pair according to the invention are provided to be rotatable with a shaft (not illustrated) inserted into a connecting portion 160 beside the hinge portion in a state in which the gears 92 of the assembled semiautomatic drive portions engage with each other.

Figure 14:
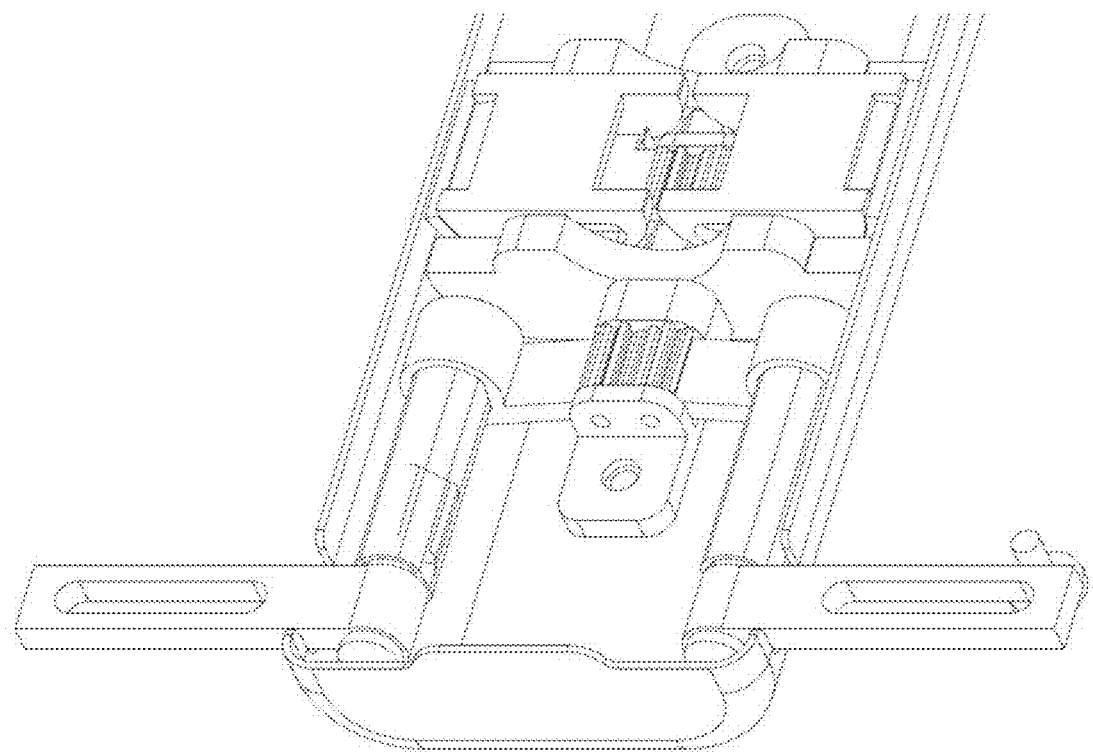
FIG. 14 is a perspective view illustrating a state in which the hinge portion and the semiautomatic drive portion have been completely installed together in the in-folding type hinge structure having a flexible display panel installed therein according to the invention.

FIG. 14 is a perspective view illustrating a state in which the hinge portion and the semiautomatic drive portion have been completely installed together in the in-folding type hinge structure having a flexible display panel installed therein according to the invention.

Referring to FIG. 14, a configuration in which the hinge portion and the semiautomatic drive portion constituting the in-folding type hinge structure having a flexible display panel installed therein according to the invention have been completely installed together is illustrated.

Rotation frames 86 of the semiautomatic drive portions and the inside supports 22 of the hinge portion are coupled to the panel portions 10 on which the flexible display panel 4 is installed such that the surfaces thereof are flush.

Figure 15:
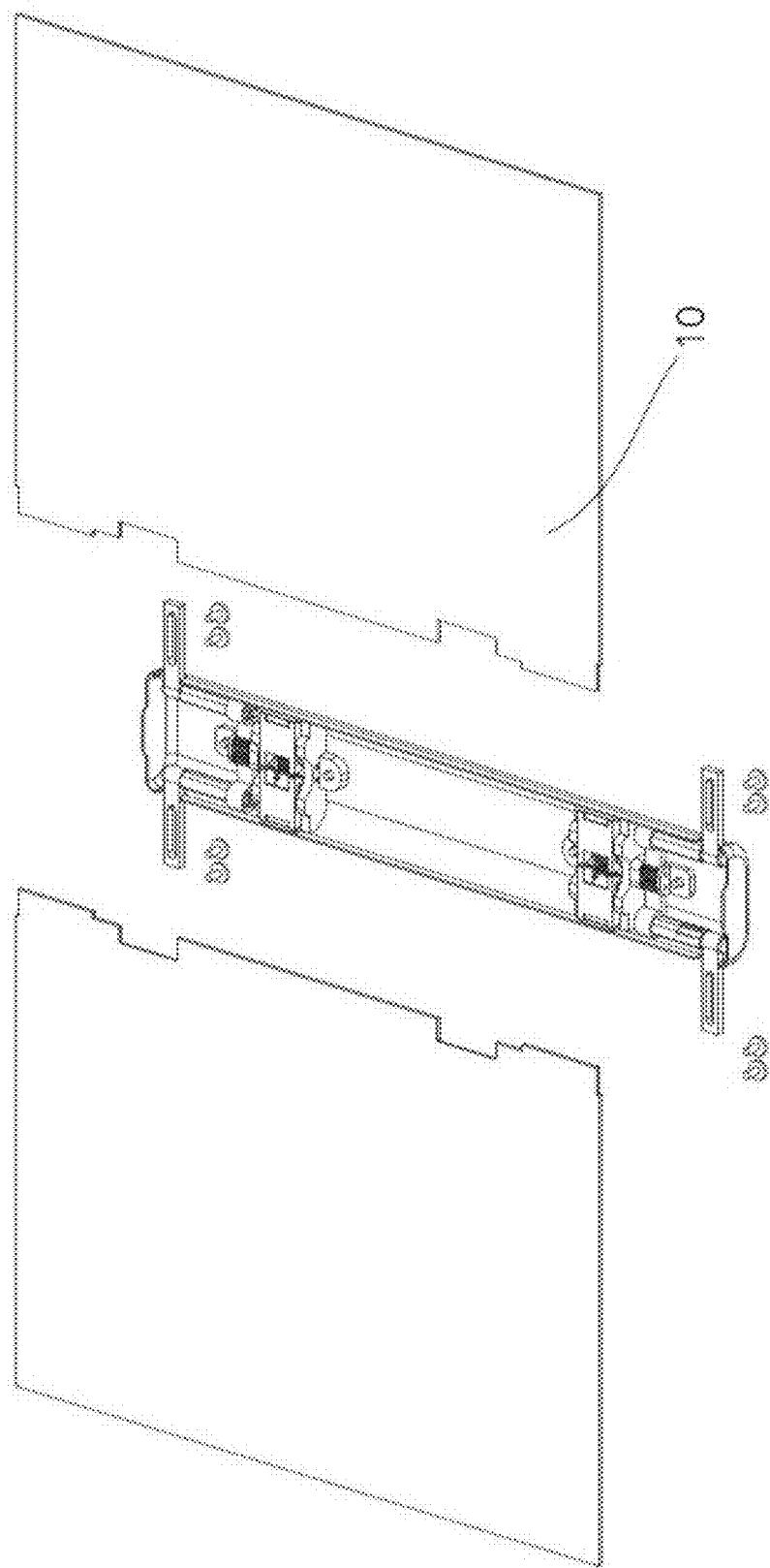
FIG. 15 is a perspective view illustrating a state in which panel portions are being coupled to the hinge portions and the semiautomatic drive portions according to the invention.

FIG. 15 is a perspective view illustrating a state in which panel portions are being coupled to the hinge portions and the semiautomatic drive portions according to the invention.

Referring to FIG. 15, the panel portions 10 are coupled to the rotation frames 86 of the semiautomatic drive portions according to the invention. The panel portions 10 on which the flexible display panel 4 is installed are coupled to the surfaces of the inside supports 22 according to the invention.

Figure 16:
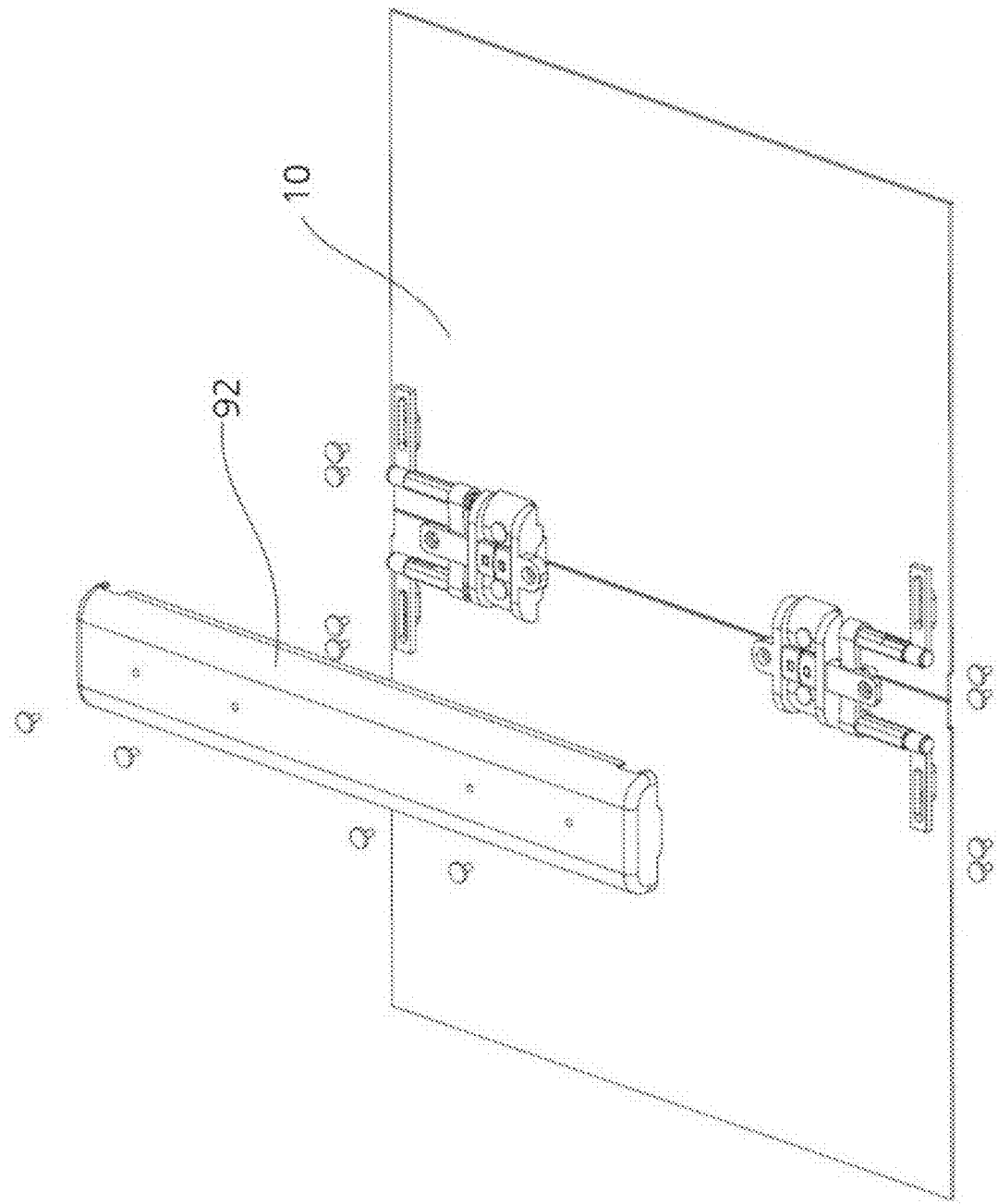
FIG. 16 is a perspective view illustrating a state in which panel portions have been coupled to the hinge portions and the semiautomatic drive portions according to the invention.

FIG. 16 is a perspective view illustrating a state in which panel portions have been coupled to the hinge portions and the semiautomatic drive portions according to the invention.

Figure 17:
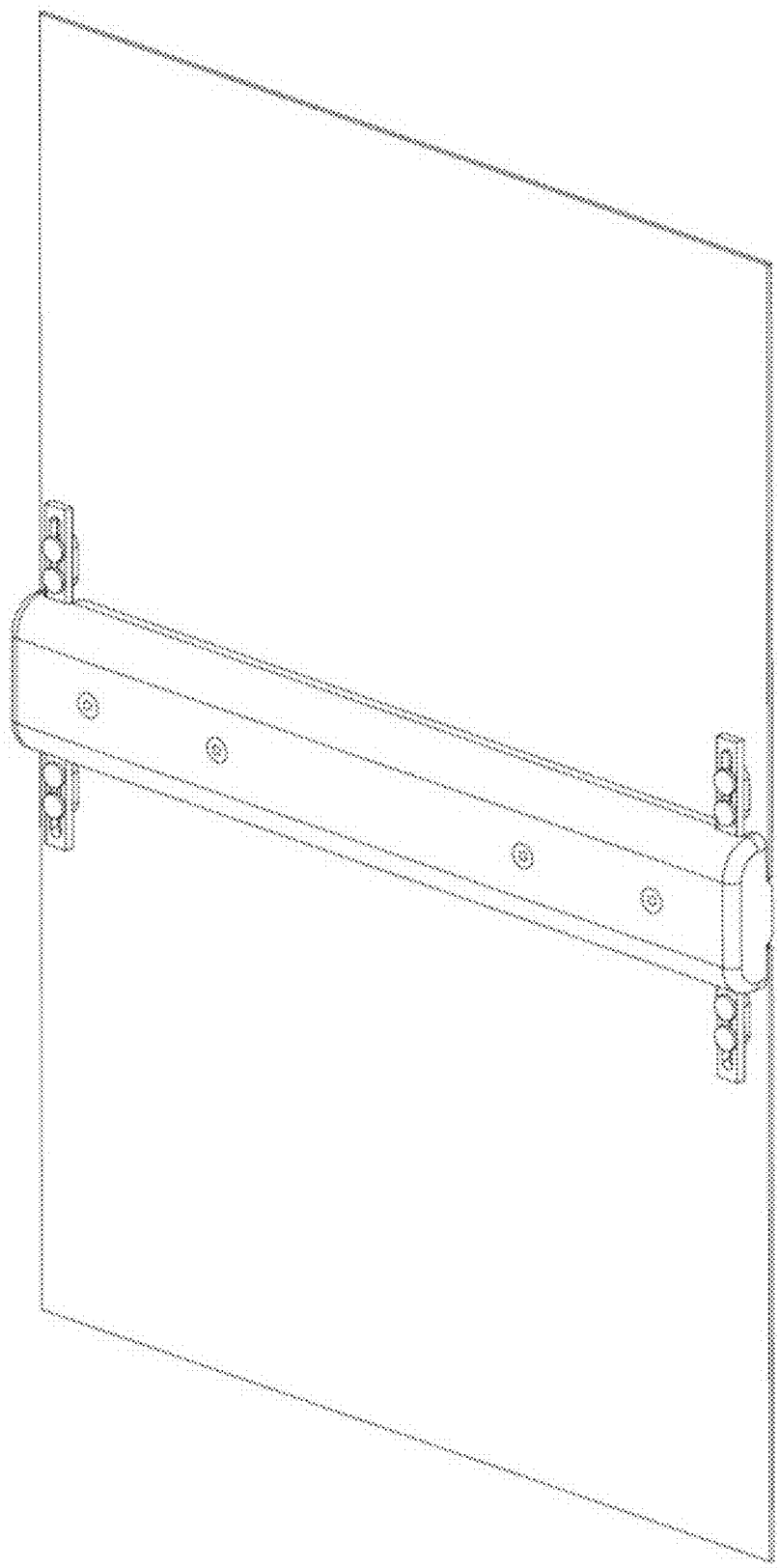
FIG. 17 is a perspective view illustrating a state in which a pair of panel portions is coupled in the in-folding type hinge structure having a flexible display panel installed therein according to the invention.

FIG. 17 is a perspective view illustrating a state in which a pair of panel portions is coupled in the in-folding type hinge structure having a flexible display panel installed therein according to the invention.

Referring to FIGS. 16 and 17, a lid 92 is installed to cover the hinge portions and the semiautomatic drive portions according to the invention after the panel portions have been coupled to the hinge portions and the semiautomatic drive portions.

Figure 18:
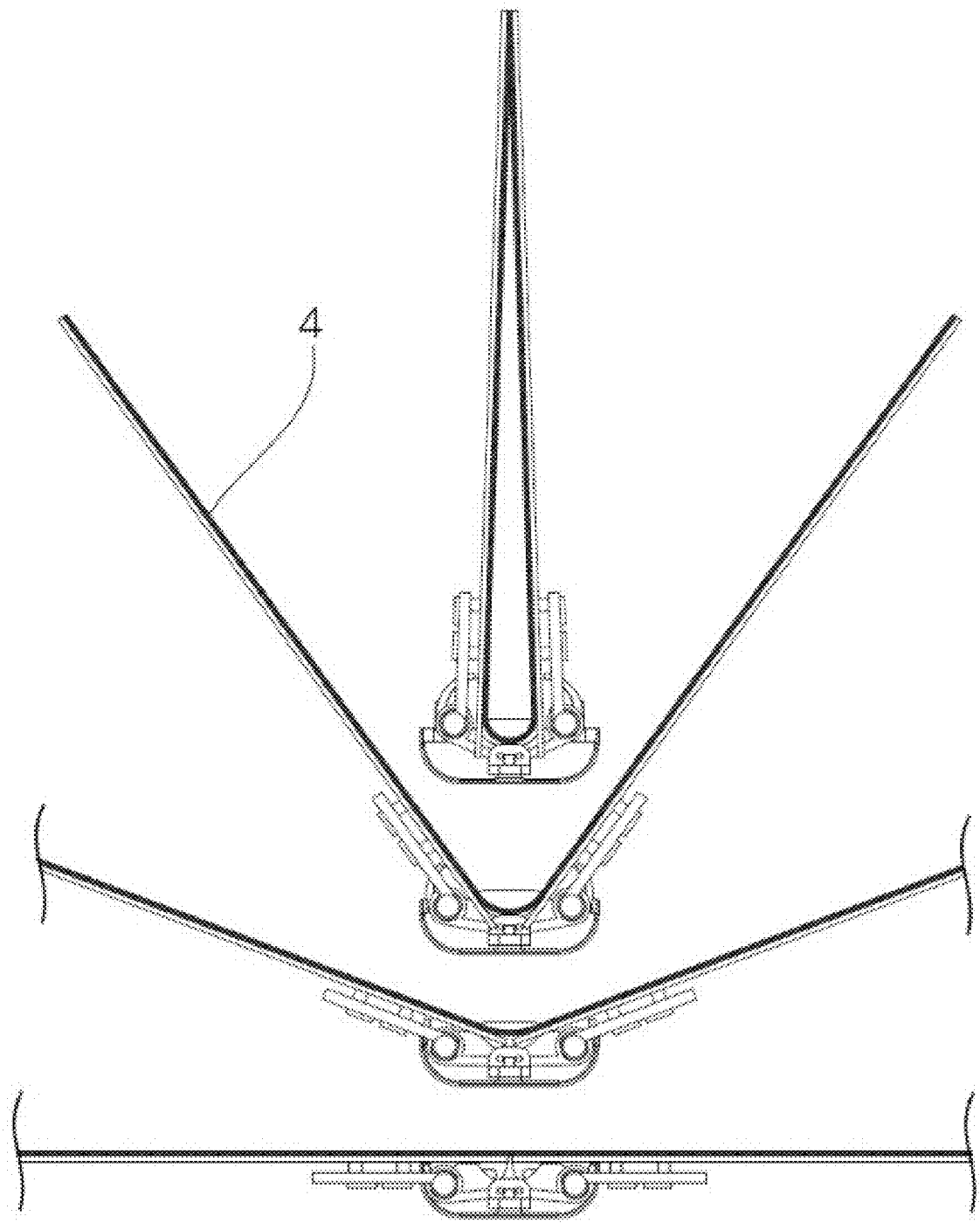
FIG. 18 is a front sectional view illustrating a state in which a pair of panel portions is coupled to the in-folding type hinge structure having a flexible display panel installed therein according to the invention by operation stages in which the panel portions are unfolded.

FIG. 18 is a front sectional view illustrating a state in which a pair of panel portions is coupled to the in-folding type hinge structure having a flexible display panel installed therein according to the invention by operation stages in which the panel portions are unfolded.

Referring to FIG. 18, when the pair of panel portions 10 are unfolded, the rotation frames 86 of the semiautomatic drive portions coupled to the panel portions 10 rotate, the translation cam 82 is pressed inside the body portion 80 with the rotation of the rotation cam 87, the pair of panel portions 10 are semi-automatically unfolded with an elastic force of the spring 84. When the pair of panel portions 10 having been unfolded is folded, the rotation cam 87 rotates in the opposite way and the pair of panel portions 10 is semi-automatically folded with an elastic force of the spring 84 in contact with the translation cam 82.

INDUSTRIAL APPLICABILITY

While an exemplary embodiment of the invention has been described above using specific terms, such description is only for explanation and it is obvious that the embodiment can be modified in various forms without departing from the technical spirit and scope of the appended claims. Such modified embodiments should not be understood separately from the spirit and scope of the invention and should belong to the appended claims.

The invention claimed is:

1. An in-folding type hinge structure having a flexible display panel installed therein, comprising:
    a hinge portion in which, in a state in which an inside support (22), a rotation support (32) of which an inner surface comes into contact with the inside support (22), and an outside support (42) that comes into contact with an outer surface of the rotation support (32) are coupled to each other, a guide rod (46) is inserted into a groove (44) of the outside support, passes through a guide groove (34) extending longitudinally in the rotation support (32), and is inserted into a groove (23) of the inside support (22),
    wherein two inside supports (22), two rotation supports (32), and two outside supports (42) are installed in a connecting portion (60) which is provided in a reception portion (54) between a pair of bodies (50) and in which gears of the two rotation supports (32) engage with each other such that the inside supports (22), the rotation supports (32), and the outside supports (42) are able to rotate simultaneously in opposite directions using two shafts (56) in a state in which the inside supports (22), the rotation supports (32), and the outside supports (42) are coupled to each other by the guide rod (46),
    wherein dual rotation including rotation of the two rotation supports (32) by the same angle in opposite directions and rotation of the inside supports (22) and the outside supports (42) along the guide grooves of the rotation supports (32) with the rotation of the rotation supports (32) is performed in the connecting portion (60) of the hinge portion, and
    wherein a guide groove (24) is formed on both side surfaces of each inside support (22), a guide protrusion (52) formed to protrude from an inner side surface of each body (50) is inserted into the corresponding guide groove (24) to limit a range in which the inside support (22) rotates, and the inside supports (22) rotate when the pair of rotation supports (32) of which gears (36) engage with each other rotates.

2. The in-folding type hinge structure having a flexible display panel installed therein according to claim 1, wherein the guide rod (46) has a large length, the groove (23) of each inside support (22) is formed to penetrate the inside support (22), the guide rod (46) is formed to pass through the groove (44) of the corresponding outside support (42), the guide groove (34), and the groove of the inside support (22), and a part of the guide rod (46) having passed therethrough is directly coupled to a panel portion (10).

3. The in-folding type hinge structure having a flexible display panel installed therein according to claim 1, further comprising a semiautomatic drive portion that is provided along with the hinge portion,
    wherein the semiautomatic drive portion includes a body portion (80) that has a groove formed therein, a spring (84) that is inserted into the body portion (80), a translation cam (82) that is inserted into the body portion (80) into which the spring (84) is inserted and moves translationally, a rotation cam (87) that rotates in a state in which the rotation cam engages with the translation cam (82) such that the translation cam (82) moves translationally, a connecting shaft (94) that passes through and connects the rotation cam (87), the translation cam (82), and the spring (84) such that the rotation cam (87), the translation cam (82), and the spring (84) are not detached, and a connecting portion (90) that is provided with a gear (92) which is coupled to the body portion (80).

* * * * *